United States Patent [19]

Suzuki et al.

[11] 4,271,061

[45] Jun. 2, 1981

[54] EPOXY RESIN COMPOSITIONS FOR SEALING SEMICONDUCTORS

[75] Inventors: Hideto Suzuki; Shunichi Hayashi; Takahiro Yoshioka, all of Ibaraki, Japan

[73] Assignee: Nitto Electric Industrial Co., Ltd., Ibaraki, Japan

[21] Appl. No.: 127,719

[22] Filed: Mar. 6, 1980

[30] Foreign Application Priority Data

Mar. 6, 1979 [JP] Japan ................................. 54/26530
Jul. 31, 1979 [JP] Japan ................................. 54/98380

[51] Int. Cl.³ ............................................. C08K 63/00
[52] U.S. Cl. ................................................ 260/37 EP
[58] Field of Search .................................... 260/37 EP

[56] References Cited

U.S. PATENT DOCUMENTS

| | | | |
|---|---|---|---|
| 3,397,169 | 8/1968 | Wilkinson | 260/37 EP |
| 3,547,871 | 12/1970 | Hofmann | 260/37 EP |
| 3,567,677 | 3/1971 | Webb | 260/37 EP |
| 3,658,750 | 4/1972 | Tsukui et al. | 260/37 EP |

*Primary Examiner*—Lewis T. Jacobs
*Attorney, Agent, or Firm*—Sughrue, Rothwell, Mion, Zinn and Macpeak

[57] ABSTRACT

In an epoxy resin composition for sealing a semiconductor element containing about 50 to 85% by weight of an inorganic filler, the improvement wherein the inorganic filler comprises at least a silica powder and a calcium silicate powder, and the amount of said calcium silicate powder is about 20 to 75% by weight and the amount of the silica powder is about 25 to 80% by weight based on the total weight of the silica powder and calcium silicate powder.

20 Claims, No Drawings

EPOXY RESIN COMPOSITIONS FOR SEALING SEMICONDUCTORS

BACKGROUND OF THE INVENTION

1. Field of the Invention

The present invention relates to epoxy resin compositions used for sealing semiconductor elements such as diodes, transistors, IC (Integrated Circuit), LSI (Large-Scale Integrated Circuit), etc.

2. Description of the Prior Art

Hitherto, in sealing a semiconductor element with a resin by transfer molding, there is a problem that strain arises inside the semiconductor elements when a rapid temperature change occurs during or after molding, due to the large difference between the thermal expansion coefficients of the inorganic material and the resin, and this easily induces large stress. Particularly, in epoxy resin compositions, because molding is generally carried out at a temperature as high as about 150° to 190° C., the resin, which has a larger thermal expansion coefficient compared to that of the semiconductor element, shrinks upon cooling to normal temperatures after molding and, consequently, the element covered with the resin receives a mechanical stress. This mechanical stress damages the semiconductor element such as by breaking or cracking and results in the occurrence of inferior goods.

On the other hand, as in the case of general molding materials, in the epoxy resin compositions used for sealing semiconductors, appropriate inorganic fillers are incorporated to reduce the cost and improve the molding operation by imparting a thixotropic property. Silica powder is a typical filler. This powder is most advantageous at present because it has excellent moldability and contains a lower amount of impurities which can adversely affect the semiconductor elements.

It has been generally known that when an inorganic filler is added to a resin composition, the thermal expansion coefficient of the molding resin decreases in proportion to the amount of the inorganic filler. From this viewpoint, it is believed that the addition of the silica powder to the epoxy resin composition reduces the difference in the thermal expansion coefficients of the molding resin and the semiconductor element, reduces the above-described mechanical stress and protects the semiconductor element from the damage of mechanical stress.

However, if the amount of the silica powder added is remarkably increased to attain such effects, it is possible to impair the moldability which is an inherent characteristic of the silica powder and also increase the modulus of elasticity of the molding resin. Since it is generally believed that the stress is proportionate to the product of the thermal expansion coefficient and the modulus of elasticity, increasing the amount of the silica powder does not necessarily result in reduction of mechanical stress, though the thermal expansion coefficient can be reduced.

As a result of investigating in detail the effects of the silica powder added in a generally admitted amount (about 50–85 wt%) in consideration of the above-described fact, it has been found that mechanical stress (measured by the method shown in the following examples) using a crystalline silica powder is about 1,800 kg/cm$^2$ and, therefore, the occurrence of flawed goods such as breakage or cracking of the element is difficult to prevent. Further, in using an amorphous silica powder to reduce the thermal expansion coefficient, the mechanical stress is reduced to about 1,500 kg/cm$^2$. In this case, the element is fairly improved compared to the case of using crystalline silica and the probability of the occurrence of inferior or flawed goods is reduced. However, the possibility of further improvement still remains.

In light of the above circumstances and as a result of studies to provide novel epoxy resin compositions capable of remarkably reducing mechanical stress without inhibiting the above-described inherent characteristics of the silica powder, the present invention has been accomplished.

The present invention is based on the discovery that the volume resistivity and the semiconductor characteristics are enhanced by using a specific inorganic filler in combination with the silica powder.

SUMMARY OF THE INVENTION

Accordingly, one object of the present invention is to provide an epoxy resin composition for sealing semiconductors with reduced mechanical stress.

A further object of the present invention is to provide an epoxy resin composition for sealing semiconductors which can reduce the mechanical stress and can also improve the volume resistivity and semiconductor characteristics.

DETAILED DESCRIPTION OF THE INVENTION

The epoxy resin composition for sealing semiconductors according to the present invention comprises about 20 to 50% by weight of en epoxy resin and about 50 to 85% by weight of an inorganic filler, wherein the inorganic filler comprises a silica powder and a calcium silicate powder and the amount of the calcium silicate powder is about 20 to 75% by weight and the amount of the silica powder is about 25 to 80% by weight, based on the total weight of the silica powder and calcium silicate powder.

The epoxy resin used in the present invention is conventionally used in sealing semiconductors and is typically a compound having 2 or more epoxy groups in the molecule, and various resins such as resins synthesized from epichlorohydrin and bisphenol A or various novolacs, alicyclic epoxy resins or epoxy resins in which halogen atoms such as bromine or chlorine are introduced to render the resins flame retardant are included. Thus, various epoxy resins can be used in the present invention and one skilled in the art can make their selection without illustrating further examples thereof.

As a hardening agent for these resins, any conventional hardening agents can be used. The examples of the hardening agent are amine hardening agents such as diaminodiphenylmethane, diaminodiphenyl sulfone, m-phenylenediamine, etc.; acid anhydride hardening agents such as phthalic acid anhydride, tetrahydrophthalic acid anhydride, pyromellitic acid anhydride, benzophenonetetracarboxylic acid anhydride, etc.; phenol novolac hardening agents having 2 or more hydroxyl groups in the molecule such as phenol novolac, cresol novolac, etc.; and catalytic hardening agents such as various imidazoles, tertiary amines, boron trifluoride compounds, etc. The amount of the hardening agent is generally about 0.5 to 2 equivalents, preferably about 0.8 to 1.2 equivalents, per the equivalent of the epoxy resin. Where a promotion-type hardening agent, such as an imidazole or tertiary amine is used the amount thereof is about 5% by weight or less, preferably about 1.5% or less, based on the weight of epoxy resin.

Of these hardening agents, the phenol novolac hardening agents are preferably used. In this case, the amount of free phenol in the phenol novolac is about 3% by weight or less, preferably about 1.5% by weight or less.

The calcium silicate powder used as one of the inorganic fillers in the composition of the present invention is an acicular powder which generally has a particle size (longer diameter) of about $1\mu$ to 2 mm, preferably about $40\mu$ to 1 mm. Particularly, of the commercially available materials wollostonite is preferably used. This calcium silicate powder is a filler suitable for reducing the mechanical stress of the molding resin without damaging an excellent moldability and adaptability to semiconductor elements of the co-present silica powder.

In order to attain this object, the amount of the calcium silicate powder used must be in the range of about 20 to 75% by weight, preferably about 30 to 60% by weight, based on the total weight of the calcium silicate powder and the silica powder. If the amount of the calcium silicate powder is less than about 20% by weight, it is extremely difficult to adequately reduce mechanical stress. On the other hand, if the amount thereof is higher than about 75% by weight, not only does the moldability deteriorate, but also the characteristics of semiconductor elements are adversely affected, and in some cases, wire opening (or sweeping) tends to occur in the semiconductor elements using a wire bond.

An acid treated calcium silicate powder can be used in place of the calcium silicate powder in the epoxy resin composition of the present invention with preferred results. The acid treated calcium silicate powder is generally obtained by treating (generally washing) the calcium silicate powder (particularly, wollostonite) with acetic acid.

The concentration of acetic acid in the treatment is not particularly limited, but an aqueous acetic acid solution having a concentration of about 0.01 to 20 N, preferably about 0.5-8 N, is generally used. The acid treatment is generally carried out as described below in a batchwise manner.

Calcium silicate powder is introduced in a vessel and then at least about 0.5 part by weight, preferably about 0.5 to 100 parts by weight, most preferably about 10 to 60 parts by weight of acetic acid, calculated as CH$_3$COOH (pure acetic acid), per 100 parts by weight of the calcium silicate powder is added thereto, optionally followed by stirring. While monitoring the pH of the supernatant, the calcium silicate powder and acetic acid are allowed to stand together in the vessel until the pH of the supernatant does not change.

Using a 1 N acetic acid, the pH becomes constant when the mixture is allowed to stand in the vessel for about 1 hour at 80° C. and about 8 to 9 hours at room temperature (e.g., about 25° to 35° C.). After the pH becomes constant, pure water is introduced into the vessel to sufficiently wash the calcium silicate powder. The amount of pure water introduced is not particularly limited, but is generally about 20 parts by weight per 1 part by weight of the calcium silicate powder. The water washing is generally repeated 3 to 5 times. In general, the operation (cycle) of pure water introduction-centrifugal water removal is repeated 3 to 5 times.

The washing is completed when the electroconductivity of the washed solution becomes generally about 50 $\mu\Omega$/cm or less. Thereafter, the moisture in the powder is removed by, for example, drying to obtain an acid treated calcium silicate powder for use in the present invention. The electroconductivity of pure water is generally about 10 $\mu\Omega$/cm or less.

The acid treated calcium silicate powder can be obtained in a continuous manner as well as the abovementioned batchwise manner. In the continuous manner, the termination of the acid treatment is determined by measuring at the time when the pH of an acetic acid aqueous solution passed through the calcium silicate powder becomes almost constant. Further, the water washing operation can also be carried out in a continuous manner.

The use of the acid treated calcium silicate is very advantageous to impart excellent volume resistivity and semiconductor characteristics to the epoxy resin composition.

The reason an epoxy resin composition for sealing semiconductors having excellent volume resistivity and semiconductor characteristics and reduced mechanical stress can be obtained using the acid treated calcium silicate powder is not clear, but the acetic acid treatment is believed to remove ionic impurities (mainly CaCO$_3$) contained in calcium silicate.

The silica powder used together with the calcium silicate powder in the present invention generally has an average particle size of about 5 to 10 $\mu$ with the maximum particle size being about 100 $\mu$. The silica powder is roughly classified into a crystalline silica powder and an amorphous silica powder. The remarkable effects from using the calcium silicate powder are obtained using either of these powders. Of these, use of the amorphous silica powder is advantageous in that the amount of the calcium silicate powder used can be reduced and the inherent characteristics of the silica powder can be maintained.

For instance, using the crystalline silica powder, when the calcium silicate powder is used in an amount of about 20% by weight or more based on the total weight of the calcium silicate powder and crystalline silica powder, the mechanical stress can be reduced to about 1,500 kg/cm$^2$ which is nearly equal to the case of using the amorphous silica powder alone and a degree of improvement thereof is remarkably large. However, in order to obtain a mechanical stress of about 1,250 kg/cm$^2$ or less which is surely capable of preventing damage to the element, the calcium silicate powder must generally be used in an amount of about 40% by weight or more based on the total weight of the calcium silicate powder and crystalline silica powder. On the other hand, in case of using the amorphous silica powder, the mechanical stress can be similarly reduced to a degree of about 1,250 kg/cm$^2$ or less by the use of the calcium silicate powder in an amount of 20% by weight or more based on the total weight of the calcium silicate powder and amorphous silica powder.

It is essential in the present invention to use at least the above-described silica powder and calcium silicate powder as inorganic fillers, but additional inorganic fillers other than the above may also be incorporated in the composition. Examples of the additional inorganic fillers are alumina, talc, clay, glass fibers, carbon black, antimony oxides, inorganic pigments, inorganic fire retardants, etc. The amount of the additional inorganic fillers used is generally about 45 parts by weight or less per 100 parts by weight of the total amount of the silica powder and calcium silicate powder.

The total amount of the inorganic fillers comprising the silica powder, the calcium silicate powder and the additional inorganic fillers must be within the range of about 50 to 85% by weight based on the total weight of the composition. If the total amount is less than about 50% by weight, it is difficult to impart a thixotropic behavior to the composition thereby deteriorating the workability of the composition and there is also a problem from the viewpoint of reducing the cost. Further, the effect of reducing mechanical stress is not sufficient. On the other hand, if the total amount is more than about 80% by weight, it also causes problems in that the moldability and the film forming ability thereof deteriorate.

The epoxy resin composition of the present invention generally comprises an epoxy resin, a hardening agent and inorganic fillers as described above, but they may additionally contain an internal release agent and a hardening accelerator. Examples of the internal release agent are long chain carboxylic acids such as stearic acid or palmitic acid; metal salts of long chain carboxylic acids such as zinc stearate or calcium stearate; and waxes such as carnauba wax or montan wax. Examples of the hardening accelerator are imidazoles, tertiary amines, phenols, organometal compounds, etc. The amount of each of the internal release agent and hardening accelerator is about 3% by weight or less, preferably about 1.5% by weight or less, based on the weight of the epoxy resin composition from which the inorganic fillers are excluded.

Further, other known additives may be used. Examples of such known additives are surface treating agents for fillers such as silane coupling agents (e.g., $\beta$-(3,4-epoxycyclohexyl)ethyltrimethoxysilane or $\gamma$-glycidoxypropyltrimethoxysilane); fire-retardants such as halogenides or phosphorus compounds; and the like.

The epoxy resin composition according to the present invention can be obtained by the conventional techniques. For example, mixing of each component can be performed by employing any of a dry blending method and a melt blending method.

As described above, the silica powder and the calcium silicate powder are used together as inorganic fillers with the specified range of the amount thereof. Therefore, the epoxy resin composition of the present invention has advantages that excellent moldability and excellent adaptability to semiconductor elements result from the silica powder and the mechanical stress is remarkably reduced without hindering both of the abovedescribed properties. In this manner damage of semiconductor elements caused by a rapid temperature change during or after molding can be prevented.

The epoxy resin composition of the present invention also has the advantage that when an acetic acid treated calcium silicate powder is used, the composition having excellent volume resistivity and semiconductor characteristics can be obtained.

Further, if the epoxy resin composition is rendered fire retardant by the use of the acid treated calcium silicate, the inherent fire retardancy can sufficiently be exhibited. The epoxy resin composition can be rendered fire retardant by using a halogen-containing fire retardant in an amount such that the amount of halogen atom is at least about 3% by weight, preferably about 3 to 8% by weight, based on the total weight of the epoxy resin composition from which the inorganic fillers are excluded. In this case, the silica powder and acid treated calcium silicate must be within the amounts specified above.

Examples of the halogen-containing fire retardant are reaction type fire retardants such as brominated bisphenol epoxy resin or brominated novolac epoxy resin prepared by introducing a halogen atom, particularly a bromine atom, into the epoxy resin; non-reaction type fire retardants such as 5-bromotoluene or chlorinated paraffin; and the like.

Inorganic fire retardant such as antimony trioxide may optionally be used in combination with the abovedescribed fire retardants. The amount of the inorganic fire retardant is generally about 1 to 15% by weight based on the weight of the whole composition.

The present invention will now be explained in greater detail by reference to the following examples. Unless otherwise indicated, all percentages, parts, ratios and the like are by weight.

EXAMPLE 1

50 parts of cresol novolac type epoxy resin (epoxy equivalents 200; softening point 80° C.), 50 parts of bisphenol A type epoxy resin (epoxy equivalents 700; softening point 80° C.), 33 parts of phenol novolac, 1.0 part of 2-methylimidazole, 300 parts of a powdery mixture of a crystalline silica powder and a wollostonite powder wherein the amount of the wollostonite powder used was 22% (Sample No. 1), 40% (Sample No. 2), 66.7% (Sample No. 3) and 72% (Sample No. 4) by weight based on the weight of the powdery mixture, 1.5 parts of silane coupling agent A-186 (trade name, produced by Nippon Unicar Co.), 2.0 parts of carbon black and 4.0 parts of Hoechst wax OP were kneaded using hot rolls heated at 70° to 80° C., and the mixture was cooled and powdered to obtain four samples of epoxy resin compositions for sealing semiconductors in accordance with the present invention.

COMPARISON EXAMPLE 1

Two kinds of epoxy resin compositions were obtained in the same manner as in Example 1 except that the amount of the wollostonite powder in the powdery mixture of the silica powder and the wollostonite powder was 17% (Sample No. 5) and 78% (Sample No. 6).

COMPARISON EXAMPLE 2

An epoxy resin composition (Sample No. 7) was obtained in the same manner as in Example 1 except that 300 parts of the silica powder was used alone instead of the powdery mixture.

The above-described seven compositions of Example 1 and Comparison Examples 1 and 2 were subjected to the measurement of mechanical stress at transfer molding, a temperature shock test and an electrolytic corrosion test.

The results obtained are shown in Table 1 below. The measurements and the tests were carried out in the following manner.

Measurement of Mechanical Stress

Each composition was transfer molded in frames of 16-pin DIP type IC setting a stress detecting element (a product of Tokyo Shibaura Electric Co., Ltd.) at 175° C. for 3 minutes. After cooling, mechanical stress was measured by means of the above-described element.

Temperature Shock Test

A temperature shock (cycle number 100 times over minus 65° C. to 125° C.) was applied to 56-pin flat packages obtained by transfer molding each composition at 175° C. for 3 minutes, and each was examined for cracks or breakage formed on the element. Table 1 shows the number of flawed goods per 100 samples.

Electrolytic Corrosion Test

Each composition was transfer molded on silicon pieces arranging therein an aluminum wire at 175° C. for 3 minutes. A voltage of 50 V was applied to the resulting moldings at 85° C. under 85% RH and examined for corrosion of the aluminum wire. Table 1 shows the percentage of flawed goods after 1,000 hours (the number of flawed goods per 100 samples).

TABLE 1

| Sample No. | Mechanical Stress (kg/cm$^2$) | Temperature Shock Test | Electrolytic Corrosion Test |
|---|---|---|---|
| Example 1: | | | |
| No. 1 | 1,450 | 5 | 0 |
| No. 2 | 1,200 | 0 | 0 |
| No. 3 | 900 | 0 | 1 |
| No. 4 | 850 | 0 | 2 |
| Comparison Example 1: | | | |
| No. 5 | 1,550 | 30 | 0 |
| No. 6 | 800 | 6* | 20 |
| Comparison Example 2: | | | |
| No. 7 | 1,800 | 50 | 0 |

*The thermal expansion coefficient of the molding becomes large to thereby cause wire opening. The value (6) in Table 1 indicates the frequency with which wire opening occurred.

As is clear from Table 1, according to the epoxy resin compositions of the present invention, the mechanical stress becomes small, generation of flawed goods caused by the temperature shock test is prevented and the electrolytic corrosion test provides good results. It is therefore apparent that the epoxy resin composition of the present invention does not adversely affect the semiconductor elements.

On the contrary, in Comparison Example 2 using the silica powder alone, the mechanical stress is large and the generation of cracks in the resin becomes remarkably high. Further, even using the calcium silicate powder, when the amount of the calcium silicate powder is less than 20% (Sample No. 5 in Comparison Example 1), reduction of the mechanical stress is small so that the degree of generation of inferior goods is still high. When the amount of the silicate powder is more than 75% (Sample No. 6 in Comparison Example 1), though cracks in the resin are not formed, wire opening occurs and inferior goods are easily formed in the electrolytic corrosion test. This means that the adverse influence upon semiconductor elements is very large.

EXAMPLE 2

100 parts of cresol novolac type epoxy resin (epoxy equivalents 220; softening point 80° C.), 50 parts of phenol novolac (softening point 80° C.), 0.7 part of 2-methylimidazole, 350 parts of a powdery mixture of an amorphous silica powder and a wollostonite powder wherein the amount of the wollostonite powder was 22% (Sample No. 8), 50% (Sample No. 9) and 72% (Sample No. 10) by weight based on the weight of the powdery mixture, 1.8 parts of silane coupling agent A-186 (trade name, produced by Nippon Unicar Co.), 2.0 parts of carbon black and 6.0 parts of carnauba wax were kneaded in the same manner as in Example 1. The mixture was cooled and powdered to obtain three kinds of epoxy resin compositions for sealing semiconductors according to the present invention.

COMPARISON EXAMPLE 3

Two kinds of epoxy resin compositions were obtained in the same manner as in Example 2 except that the amount of the wollostonite powder in the powdery mixture of the silica powder and the wollostonite powder was 17% (Sample No. 11) and 78% (Sample No. 12).

COMPARISON EXAMPLE 4

An epoxy resin composition (Sample No. 13) was produced in the same manner as in Example 2 except that the silica powder was used alone in the amount of 350 parts instead of the powdery mixture.

The same measurements of mechanical stress, temperature shock test and electrolytic corrosion test as used in Example 1 were carried out using the above-described six compositions obtained in Example 2 and Comparison Examples 3 and 4. The results obtained are shown in Table 2 below.

TABLE 2

| Sample No. | Mechanical Stress (kg/cm$^2$) | Temperature Shock Test | Electrolytic Corrosion Test |
|---|---|---|---|
| Example 2: | | | |
| No. 8 | 1,250 | 0 | 0 |
| No. 9 | 1,000 | 0 | 0 |
| No. 10 | 800 | 0 | 2 |
| Comparison Example 3: | | | |
| No. 11 | 1,300 | 3 | 0 |
| No. 12 | 750 | 0 | 20 |
| Comparison Example 4: | | | |
| No. 13 | 1,500 | 8 | 0 |

As is clear from the above Table 2, comparatively good results were obtained in mechanical stress and the temperature shock test when the amorphous silica powder was used as the silica powder, even though it is used alone in Comparison Example 4. However, it can be understood that the above-described characteristics are more improved when the calcium silicate powder is used together with the silica powder. Further, using the calcium silicate powder, it is seen that if the amount thereof is lower than 20% (Sample No. 11 in Comparison Example 3), the above-described improvements cannot be obtained and if the amount thereof is more than 75% (Sample No. 12 in Comparison Example 3), it causes problems in the electrolytic corrosion test thereby adversely affecting the semiconductor elements.

EXAMPLE 3

Preparation of Acid Treated Calcium Silicate 6 liters of 1 N aqueous acetic acid solution and 720 g of wollostonite powder were charged in a vessel and stirred at 80° C. for 1 hour. Once the pH was constant, the powder was filtered off and washed with pure water (ion exchange water) repeatedly.

When the electroconductivity of the washed solution was 50 µΩ/cm or less, the washing operation was stopped and the residual moisture was volatized at 180° C. for 16 hours to obtain the acid treated calcium silicate.

Preparation of Epoxy Resin Composition 80 parts of cresol novolac type epoxy resin (epoxy equivalents 220; softening point 80° C.), 20 parts of brominated bisphenol A type epoxy resin (epoxy equivalents 375; softening point 55° C.; bromine content 45 wt%), 50 parts of phenol novolac containing a free phenol of 3% or less (softening point 80° C.), 0.7 part of 2-methylimidazole, 20 parts of antimony oxide, 1.8 parts of silane coupling agent ("A-186", trade name, produced by Nippon Unicar Co.), 2.0 parts of carbon black, 6.0 parts of carnauba wax and 350 parts of an inorganic filler (a powdery mixture of an amorphous silica powder and the acid treated calcium silicate above wherein the amount of the acid treated calcium silicate was 50% by weight based on the weight of the powdery mixture) were kneaded using hot rolls heated at 70° to 80° C., and the mixture was cooled and powdered to obtain an epoxy resin composition of the present invention.

REFERENCE EXAMPLE 1

An epoxy resin composition was produced in the same manner as in Example 3 except that wollostonite which was not treated with acetic acid was used instead of the acid treated calcium silicate.

EXAMPLE 4

An epoxy resin composition was produced in the same manner as in Example 3 except that 200 parts of the powdery mixture wherein the amount of the acid treated calcium silicate was 30% was used as the inorganic filler.

REFERENCE EXAMPLE 2

An epoxy resin composition was produced in the same manner as in Example 4 except that wollostonite powder which was not treated with acetic acid was used instead of the acid treated calcium silicate.

EXAMPLE 5

An epoxy resin composition was produced in the same manner as in Example 3 except that the proportion of the acid treated calcium silicate in the powdery mixture was changed to 70%.

REFERENCE EXAMPLE 3

An epoxy resin composition was produced in the same manner as in Example 5 except that wollostonite which was not treated with acetic acid was used instead of the acid treated calcium silicate.

Each composition obtained in Examples 3 to 5 and Reference Examples 1 to 3 was subjected to the measurement of mechanical stress at transfer molding, fire retardant test, measurement of volume resistivity at 150° C. and electrolytic corrosion test.

The results obtained are shown in Table 3 below. The measurement of mechanical stress and the electrolytic corrosion test was carried out in the same manner as described above. The fire retardant test and the measurement of volume resistivity were carried out in the following manner.

Fire Retardant Test

Each composition is transfer molded at 160° C. for 2 minutes, followed by after-curing at 160° C. for 16 hours to obtain a test piece having a size of 12.5×125×1.6 mm. The fire retardancy of this test piece was measured according to UL Standard, 94-V-0.

Measurement of Volume Resistivity

Each composition is transfer molded at 160° C. for 2 minutes, followed by after-curing at 160° C. for 16 hours to obtain a test piece (disk) having a thickness of 2 mm and a diameter of 10 mm. The volume resistivity of this test piece was measured according to JIS K-6911.

TABLE 3

| Example No. (Reference Example) | Mechanical Stress (kg/cm$^2$) | Fire Retard- ancy | Volume Resistivity at 150° C. (Ωcm) | Electrolytic Corrosion Test |
|---|---|---|---|---|
| 1 | 1,000 | Passed | $1 \times 10^{12}$ | 3 |
| (1) | 1,000 | Failed | $2 \times 10^{11}$ | 11 |
| 2 | 1,100 | Passed | $3 \times 10^{12}$ | 1 |
| (2) | 1,100 | Failed | $1 \times 10^{12}$ | 3 |
| 3 | 750 | Passed | $8 \times 10^{11}$ | 5 |
| (3) | 750 | Failed | $9 \times 10^{10}$ | 20 |

EXAMPLE 6

50 parts of cresol novolac type epoxy resin (epoxy equivalents 220; softening point 80° C.), 50 parts of bisphenol A type epoxy resin (epoxy equivalents 700; softening point 80° C.), 33 parts of phenol novolac, 1.0 part of 2-methylimidazole, 570 parts of a powdery mixture of a crystalline silica and the acid treated calcium silicate wherein the amount of the acid treated calcium silicate was 22% (Sample No. 14), 40% (Sample No. 15), 66.7% (Sample No. 16) and 72% (Sample No. 17), based on the weight of the powdery mixture, 1.5 parts of silane coupling agent "A-186" (trade name, produced by Nippon Unicar Co.), 2.0 parts of carbon black and 4.0 parts of Hoechst wax OP were kneaded using hot rolls heated at 70° to 80° C., and the mixture was cooled and powdered to obtain four kinds of epoxy resin compositions for sealing semiconductors of the present invention.

REFERENCE EXAMPLE 4

Four kinds of epoxy resin compositions were obtained in the same manner as in Example 6 except that wollostonite powder which was not treated with acetic acid was used instead of the acid treated calcium silicate.

The characteristics of the epoxy resin compositions obtained in Example 6 and Reference Example 4 were measured.

The results obtained are shown in Table 4 below. The sample Nos. 14', 15', 16' and 17' in Reference Example 4 correspond to the sample Nos. 14, 15, 16 and 17 in Example 6.

TABLE 4

| Sample No. | Mechanical Stress (kg/cm$^2$) | Volume Resistivity at 150° C. (Ωcm) | Electrolytic Corrosion Test |
|---|---|---|---|
| Example 6: | | | |
| No. 14 | 1,800 | $2 \times 10^{12}$ | 2 |

TABLE 4-continued

| Sample No. | Mechanical Stress (kg/cm$^2$) | Volume Resistivity at 150° C. (Ωcm) | Electrolytic Corrosion Test |
|---|---|---|---|
| No. 15 | 1,400 | 9 × 10$^{11}$ | 4 |
| No. 16 | 1,150 | 6 × 10$^{11}$ | 7 |
| No. 17 | 1,000 | 3 × 10$^{11}$ | 10 |
| Reference Example 4: | | | |
| No. 14' | 1,800 | 1 × 10$^{12}$ | 5 |
| No. 15' | 1,400 | 6 × 10$^{11}$ | 10 |
| No. 16' | 1,150 | 3 × 10$^{11}$ | 17 |
| No. 17' | 1,000 | .9 × 10$^{10}$ | 20 |

It is apparent from the results shown in Tables 3 and 4 that use of the acid treated calcium silicate powder can greatly improve the fire retardancy and the volume resistivity as compared to use of the calcium silicate powder which is not treated with acetic acid.

While the invention has been described in detail and with reference to specific embodiments thereof, it will be apparent to one skilled in the art that various changes and modifications can be made therein without departing from the spirit and scope thereof.

What is claimed is:

1. In an epoxy resin composition for sealing a semiconductor element containing about 50 to 85% by weight of an inorganic filler, the improvement wherein the inorganic filler comprises at least a silica powder and a calcium silicate powder, and the amount of said calcium silicate powder is about 20 to 75% by weight and the amount of the silica powder is about 25 to 80% by weight, based on the total weight of the silica powder and calcium silicate powder.

2. The composition of claim 1, wherein the amount of the calcium silicate powder is about 30 to 60% by weight.

3. The composition of claim 1, wherein the calcium silicate powder is a needle-like material having a particle size (longer diameter) of about 1μ to about 2 mm.

4. The composition of claims 1, 2 or 3, wherein the calcium silicate powder is an acetic acid treated calcium silicate powder.

5. The composition of claim 1, wherein the silica powder is a crystalline silica or an amorphous silica.

6. The composition of claims 1 or 5, wherein the silica powder has an average particle size of about 5 to 10μ with the maximum particle size being about 100μ.

7. The composition of claim 3, wherein said calcium silicate powder is wollostonite.

8. The composition of claim 1, wherein said composition is fire retardant.

9. In a semiconductor which is sealed with an epoxy resin composition, the improvement in which said resin composition comprises about 50 to 85% by weight of an inorganic filler, which comprises at least a silica powder and a calcium silicate powder, and the amount of said calcium silicate powder is about 20 to 75% by weight and the amount of the silica powder is about 25 to 80% by weight, based on the total weight of the silica powder and calcium silicate powder.

10. The semiconductor of claim 9, wherein the amount of the calcium silicate powder is about 30 to 60% by weight.

11. The semiconductor of claim 9, wherein the calcium silicate powder is a needle-like material having a particle size (longer diameter) of about 1μ to about 2 mm.

12. The semiconductor of claims 9, 10 or 11, wherein the calcium silicate powder is an acetic acid treated calcium silicate powder.

13. The semiconductor of claim 9, wherein the silica powder is a crystalline silica or an amorphous silica.

14. The semiconductor of claims 9 or 13, wherein the silica powder has an average particle size of about 5 to 10μ with the maximum particle size being about 100μ.

15. The semiconductor of claim 11, wherein said calcium silicate powder is wollostonite.

16. The semiconductor of claim 9, wherein said composition is fire retardant.

17. The composition of claim 1, wherein the amount of inorganic fillers other than silica powder and calcium silicate powder is less than 45 parts by weight per 100 parts by weight silica and calcium silicate powder.

18. The semiconductor of claim 9, wherein the amount of inorganic fillers other than silica powder and calcium silicate powder is less than 45 parts by weight per 100 parts by weight silica and calcium silicate powder.

19. The composition of claim 1, wherein said inorganic filler consists of silica and calcium silicate powder.

20. The semiconductor of claim 9, wherein said inorganic filler consists of silica and calcium silicate powder.

* * * * *